(12) United States Patent
Kim et al.

(10) Patent No.: US 10,790,750 B2
(45) Date of Patent: Sep. 29, 2020

(54) ISOLATED DC-DC CONVERTER CIRCUIT FOR POWER CONVERSION AND DRIVING METHOD THEREOF

(71) Applicant: Korea Electronics Technology Institute, Seongnam-si (KR)

(72) Inventors: Jin-Hong Kim, Suwon-si (KR);
Joon-Sung Park, Seoul (KR);
Jun-Hyuk Choi, Bucheon-si (KR);
Byong-Jo Hyon, Gunpo-si (KR);
Yong-Su Noh, Bucheon-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 143 days.

(21) Appl. No.: 16/117,528

(22) Filed: Aug. 30, 2018

(65) Prior Publication Data
US 2019/0068060 A1    Feb. 28, 2019

(30) Foreign Application Priority Data
Aug. 31, 2017  (KR) ........................ 10-2017-0111312

(51) Int. Cl.
*H02M 3/335* (2006.01)
*H02M 3/158* (2006.01)
(Continued)

(52) U.S. Cl.
CPC ..... *H02M 3/1584* (2013.01); *H02M 3/33523* (2013.01); *H02M 3/33569* (2013.01);
(Continued)

(58) Field of Classification Search
CPC .. H02M 3/33546; H02M 3/335; H02M 3/285; H01F 27/24; H01F 27/2823
(Continued)

(56) References Cited

U.S. PATENT DOCUMENTS 2,738,673 A * 3/1956 Campani ............... G01F 23/266
                                                         73/304 C
3,343,405 A * 9/1967 Gilinson, Jr. .......... G01N 11/14
                                                         73/54.33
(Continued)

FOREIGN PATENT DOCUMENTS

JP    2002-084754 A    3/2002

OTHER PUBLICATIONS

Korean Office Action dated Jun. 2, 2020 in corresponding Korean Patent Application No. 10-2017-0111312 (5 pages in Korean).
(Continued)

*Primary Examiner* — Thienvu V Tran
*Assistant Examiner* — Nusrat Quddus
(74) *Attorney, Agent, or Firm* — NSIP Law

(57) ABSTRACT

The present disclosure provides an isolated DC-DC converter and a driving method thereof. The isolated DC-DC converter includes: a switching unit connected to terminals of a power supply, comprising three pairs of switches connected in parallel, and configured to switch on and off the three pairs of switches; a transformer unit comprising a first through third transformers, each having a primary winding connected to the switching unit and a secondary winding that are wound in a predetermined turns ratio and transforming a voltage applied to the primary winding according to the turns ratio; a post-processing unit connected to the secondary winding of each of the first through third transformers and configured to rectify and filter a voltage induced in the secondary winding to generate and output an output voltage; and a control unit connected to the switching unit and configured to control switching operation of the switching unit by providing the switching unit with carriers and reference voltages.

9 Claims, 11 Drawing Sheets

(51) Int. Cl.
*H03K 7/08* (2006.01)
*H02M 1/00* (2006.01)
*H02M 7/5387* (2007.01)
*H02M 7/5395* (2006.01)

(52) U.S. Cl.
CPC .......... *H02M 3/33576* (2013.01); *H03K 7/08* (2013.01); *H02M 7/5387* (2013.01); *H02M 7/5395* (2013.01); *H02M 2001/0003* (2013.01); *H02M 2003/1586* (2013.01)

(58) Field of Classification Search
USPC .................................................. 363/131–132
See application file for complete search history.

(56) References Cited

U.S. PATENT DOCUMENTS

| | | | | |
|---|---|---|---|---|
| 3,600,597 | A * | 8/1971 | Swerdlow | H01F 30/10 307/17 |
| 4,184,197 | A * | 1/1980 | Cuk | H02M 3/005 363/16 |
| 4,689,524 | A * | 8/1987 | Ureche | H05B 41/2988 315/206 |
| 5,287,888 | A * | 2/1994 | Geiger | A01G 25/162 137/624.2 |
| 5,442,534 | A * | 8/1995 | Cuk | H02M 3/005 363/16 |
| 5,852,553 | A * | 12/1998 | Stacey | H02M 7/49 363/64 |
| 6,744,648 | B2 * | 6/2004 | Chen | H02J 3/18 363/132 |
| 7,932,693 | B2 * | 4/2011 | Lee | H02M 7/53875 318/701 |
| RE47,276 | E * | 3/2019 | Benjamin | H02M 3/335 |
| 2002/0031160 | A1 * | 3/2002 | Desor | H01S 3/225 372/57 |
| 2003/0206391 | A1 * | 11/2003 | Princinsky | H02H 9/04 361/600 |
| 2005/0105305 | A1 * | 5/2005 | Sawada | H02M 1/4225 363/34 |
| 2007/0159115 | A1 * | 7/2007 | Kang | H05B 41/245 315/274 |
| 2009/0185398 | A1 * | 7/2009 | Cuk | H02M 1/34 363/21.1 |
| 2009/0309425 | A1 * | 12/2009 | Princinsky | H02J 3/01 307/105 |
| 2010/0001655 | A1 * | 1/2010 | Han | H05B 41/2827 315/276 |
| 2010/0072824 | A1 * | 3/2010 | Abolhassani | H02M 7/49 307/82 |
| 2016/0254756 | A1 * | 9/2016 | Yang | H01F 30/12 363/21.02 |
| 2018/0152112 | A1 * | 5/2018 | Torrico-Bascope | H01F 27/00 |
| 2019/0199223 | A1 * | 6/2019 | Lin | H02M 3/33523 |
| 2019/0348918 | A1 * | 11/2019 | Ojika | H02M 1/14 |

OTHER PUBLICATIONS

Wang et al., "Unified Modulation for Three-phase Current-fed Bidirectional DC-DC Converter Under Varied Input Voltage," IEEE 2010, pp. 807-812.

* cited by examiner

ISOLATED DC-DC CONVERTER CIRCUIT FOR POWER CONVERSION AND DRIVING METHOD THEREOF

CROSS-REFERENCE TO RELATED APPLICATION

The present application claims the benefit of priority to Korean Patent Application No. 10-2017-0111312, filed on Aug. 31, 2017, in the Korean Intellectual Property Office, the disclosure of which is incorporated herein in its entirety by reference.

TECHNICAL FIELD

The present disclosure relates to a DC-DC converter, and more particularly, to an isolated DC-DC converter having reduced volume and performing a switching operation by use of three-phase duty control. Also, the present disclosure relates to a method of driving the isolated DC-DC converter.

BACKGROUND

In an electric device that requires charging or discharging of a battery, an isolated DC-DC converter that steps up or down a voltage level may be used for electrical stability. The most typical DC-DC converter is an isolated full bridge converter. An example of the isolated full bridge DC-DC converter is disclosed in Korean patent publication No. 10-1031278 entitled ISOLATED DC/DC CONVERTER USING FULL-BRIDGE TOPOLOGY.

In addition to an electrical insulation performance, the isolated full bridge converter is advantageous in that the voltage level can be stepped up or down, as necessary, according to a turns ratio and the efficiency of the converter can be increased by zero voltage switching.

However, the isolated full bridge converter employs a single transformer and a single output inductor, and thus has a problem that the size of the transformer and the output inductor for charging or discharging increases in case that the output current is large. Furthermore, a pulse-width-modulation (PWM) control of the isolated full bridge converter is complicated since the PWM control uses a phase shift scheme.

SUMMARY

Provided are an isolated DC-DC converter that has an enhanced volumetric property and can be controlled easily and a driving method of the isolated DC-DC converter.

According to an aspect of an exemplary embodiment, an isolated DC-DC converter includes: a switching unit connected to terminals of a power supply, comprising three pairs of switches connected in parallel, and configured to switch on and off the three pairs of switches; a transformer unit comprising a first through third transformers, each having a primary winding connected to the switching unit and a secondary winding that are wound in a predetermined turns ratio and transforming a voltage applied to the primary winding according to the turns ratio; a post-processing unit connected to the secondary winding of each of the first through third transformers and configured to rectify and filter a voltage induced in the secondary winding to generate and output an output voltage; and a control unit connected to the switching unit and configured to control switching operation of the switching unit by providing the switching unit with carriers and reference voltages.

The switching unit may include: a first switch having a first terminal connected to a first terminal of the power supply; a second switch having a first terminal connected to a second terminal of the first switch, and a second terminal connected to a second terminal of the power supply; a third switch having a first terminal connected to the first terminal of the first switch; a fourth switch having a first terminal connected to a second terminal of the third switch, and a second terminal connected to the second terminal of the second switch; a fifth switch having a first terminal connected to the first terminal of the third switch; and a sixth switch having a first terminal connected to a second terminal of the fifth switch, and a second terminal connected to the second terminal of the fourth switch.

In the switching unit, a midpoint node between the first switch and the second switch may be connected to a first terminal of the primary winding of the first transformer and a second terminal of the primary winding of the second transformer. A midpoint node between the third switch and the fourth switch may be connected to a first terminal of the primary winding of the second transformer and a second terminal of the primary winding of the third transformer. A midpoint node between the fifth switch and the sixth switch may be connected to a first terminal of the primary winding of the third transformer and a second terminal of the primary winding of the first transformer.

In the transformer unit, the first through the third transformers may have same specification as each other. In each of the first through third transformers, the turns ratio may be set such that the number of turns of the primary winding is larger than the number of turns of the secondary winding.

The post-processing unit may include: a first output inductor having a terminal connected to a first terminal of a load; a first rectifier diode having a cathode connected to a second terminal of the first output inductor and an anode connected to a second terminal of the load; a second output inductor having a first terminal connected the first terminal of the first output inductor; a second rectifier diode having a cathode connected to a second terminal of the second output inductor 44 and an anode connected to the anode of the first rectifier diode 42; a third output inductor having a first terminal connected the first terminal of the second output inductor; and a second rectifier diode having a cathode connected to a second terminal of the third output inductor and an anode connected to the anode of the second rectifier diode.

A midpoint node between the first output inductor and the first rectifier diode may be connected to a first terminal of the secondary winding of the first transformer and a second terminal of the secondary winding of the second transformer. A midpoint node between the second output inductor and the second rectifier diode may be connected to the a first terminal of the secondary winding of the second transformer and a second terminal of the secondary winding of the third transformer. A midpoint node between the third output inductor and the third rectifier diode may be connected to the a first terminal of the secondary winding of the third transformer and a second terminal of the secondary winding of the first transformer.

The control unit may provide the switching unit with three carries carriers phase-shifted by 120 degrees from each other and the reference voltages in a direct current voltage range from 0 volt to ⅔ volt to control the switching unit.

The control unit may increase the output voltage by controlling the duty ratio to be increased while the reference voltages ranging from 0V to ⅓ V is applied, so that a time period for which the reference voltage of $\frac{1}{3}V_{DC} \times n$ is applied to the post-processing unit 40 is increased, where "n" denotes a turns ratio that is a ratio of a number of windings in a primary side to a number of windings in a secondary side in the transformer unit, and "$V_{DC}$" denotes an output voltage of the power supply.

The control unit may increase the output voltage by controlling the duty ratio to be increased while the reference voltages ranging from ⅓V to ⅔V is applied, so that a time period for which the voltage of ⅓$V_{DC}$×n is applied to the post-processing unit is decreased but a time period for which the voltage of ⅔$V_{DC}$×n is applied to the post-processing unit is increased.

According to another aspect of an exemplary embodiment, a method of driving an isolated dc-dc converter, includes: applying carriers and reference voltages to a switching unit comprising three pairs of switches connected in parallel; changing switching state of the switching unit by using the carriers and the reference voltages; transforming a level of a voltage output by the switching unit in a transformer unit comprising a first through third transformer; and rectifying and filtering a transformed voltage to generate an output voltage.

Further variations, modifications, areas of applicability will become apparent from the description provided herein. It should be understood that the description and specific examples are intended for purposes of illustration only and are not intended to limit the scope of the present disclosure.

The present disclosure allows a designer or manufacturer of the isolated DC-DC converter to employ three transformers and output inductors which are smaller than those in a conventional converter, and the volume of the converter may not increase even when the output current is large.

The isolated DC-DC converter performs the switching operation by use of the three-phase duty control, which simplifies and facilitates the PWM control of the switching operation.

Therefore, the present disclosure can enhance output efficiency of the isolated DC-DC converter and lower the manufacturing cost of the converter.

BRIEF DESCRIPTION OF THE DRAWINGS

In order that the disclosure may be well understood, there will now be described various forms thereof, given by way of example, reference being made to the accompanying drawings, in which.

DETAILED DESCRIPTION

Figure 1:
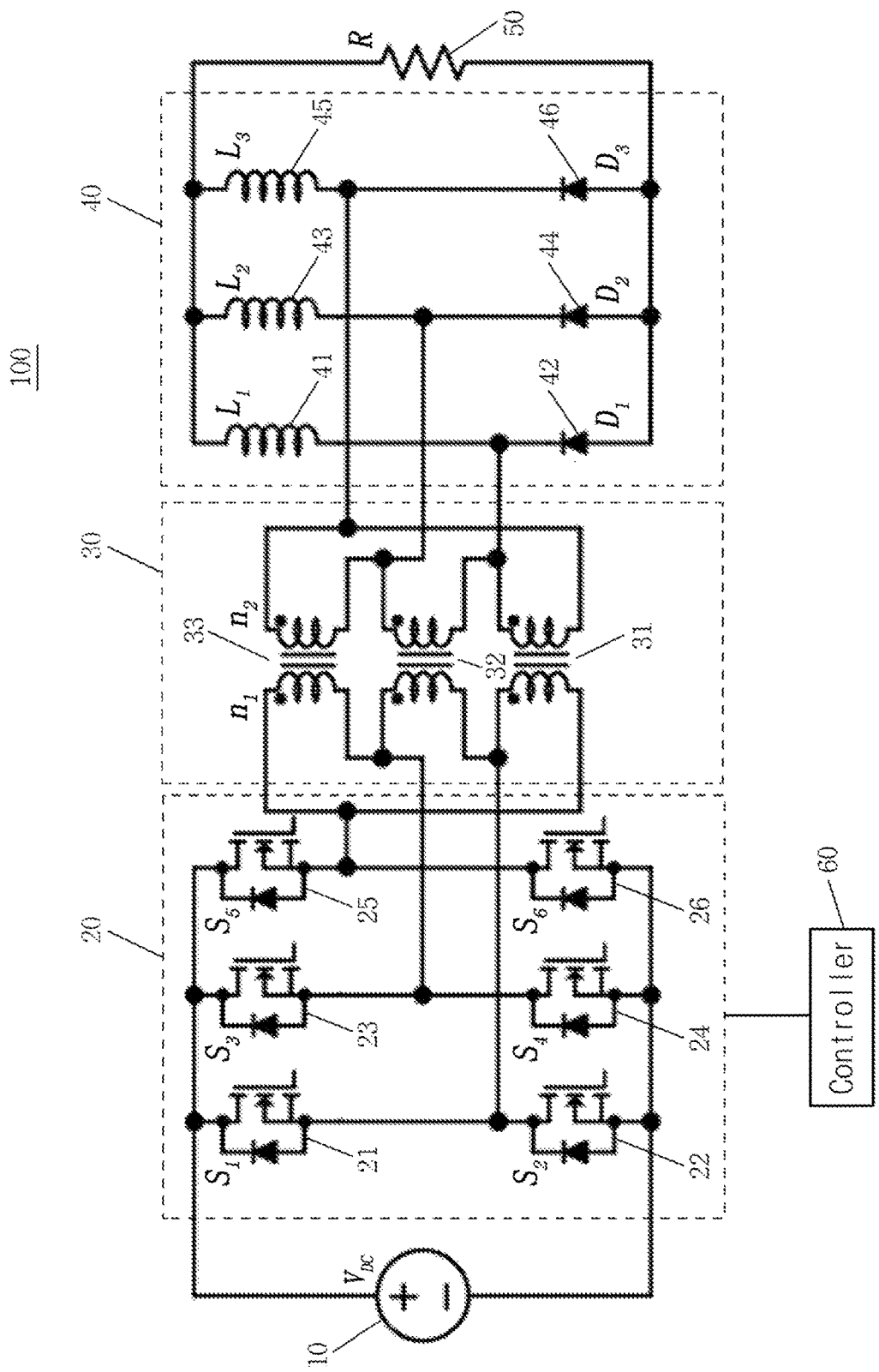
FIG. 1 is an exemplary circuit diagram of an isolated DC-DC converter according to an embodiment of the present disclosure.

For a more clear understanding of the features and advantages of the present disclosure, the present disclosure will be described in detail with reference to the accompanied drawings. In the drawings, the same reference numerals are used to designate the same or similar elements throughout the drawings. In the following description, a detailed description of a technical element or function known in the art may be omitted when such a description is deemed to be obvious or may make the subject matter of the present disclosure unclear.

FIG. 1 is an exemplary circuit diagram of an isolated DC-DC converter according to an embodiment of the present disclosure.

Referring to FIG. 1, the isolated DC-DC converter 100, which may have a reduced volume and can easily perform a pulse-width-modulation (PWM) control of a switching operation, includes a switching unit 20, a transformer unit 30, a post-processing unit 40, and a control unit 60. Also, the isolated DC-DC converter 100 further includes a power supply 10. Further, a load 50 is additionally shown in FIG. 1.

The switching unit 20 is connected between both terminals of the power supply 10. Here, the power supply 10 constantly supplies direct current (DC) power, and has a first and second terminals which preferably are an anode and a cathode, respectively. The switching unit 20 is composed of a three-phase circuit having the same structure as a three-phase inverter. That is, the switching unit 20 includes three switching legs connected in parallel, and each of the switching legs has a pair of switches. The switching unit 20 includes a first switch 21, a second switch 22, a third switch 23, a fourth switch 24, a fifth switch 25 and a sixth switch 26. In the switching unit 20, the first switch 21 and the second switch 22 connected in series form a first switching leg, the third switch 23 and the fourth switch 24 connected in series form a second switching leg, and the fifth switch 25 and the sixth switch 26 connected in series form a third switching leg.

Specifically, the first switch 21 has a first terminal connected to the first terminal of the power supply 10. The second switch 22 has a first terminal connected to a second terminal of the first switch 21, and a second terminal connected to the second terminal of the power supply 10.

The third switch 23 has a first terminal connected to the first terminal the first switch 21. The first terminal of the third switch 23 is connected also to the first terminal of the power supply 10. The fourth switch 24 has a first terminal connected to the second terminal of the third switch 23, and a second terminal connected to the second terminal of the second switch 22. The second terminal of the fourth switch 24 is connected also to the second terminal of the power supply 10.

The fifth switch 25 has a first terminal connected to the first terminal the third switch 23. The first terminal of the fifth switch 25 is connected also to the first terminal of the power supply 10 and the first terminal the first switch 21. The sixth switch 26 has a first terminal connected to the second terminal of the fifth switch 25, and a second terminal connected to the second terminal of the fourth switch 24. The second terminal of the sixth switch 26 is connected also to the second terminal of the power supply 10 and the second terminal of the second switch 22.

In the transformer unit 30, primary and secondary windings can be connected in a wye connection and/or a delta connection. The transformer unit 30 includes a first through a third transformers 31-33 each of which has a primary winding and a secondary winding that are wound at predetermined turns ratios. The transformer unit 30 can be set such that the first through third transformers 31-33 have same specifications as each other. Also, in each of the first through third transformers 31-33, it may be preferable that the turns ratio is set such that the number of turns of the primary winding is larger than the number of turns of the secondary winding. The transformer unit 30 steps up or down the voltage applied to the primary side according to the turns ratio, and outputs stepped-up or stepped-down voltage to the secondary side. The primary windings of each of the transformers 31-33 in the transformer unit 30 are connected to the switching unit 20.

In more detail, a midpoint node at which the second terminal of the first switch 21 is connected to the first terminal of the second switch 22 is connected to a first terminal of the primary winding of the first transformer 31 and a second terminal of the primary winding of the second transformer 32. The a midpoint node at which the second terminal of the third switch 23 is connected to the first terminal of the fourth switch 24 is connected to a first terminal of the primary winding of the second transformer 32 and a second terminal of the primary winding of the third transformer 33. The a midpoint node at which the second terminal of the fifth switch 25 is connected to the first terminal of the sixth switch 26 is connected to a first terminal of the primary winding of the third transformer 33 and a second terminal of the primary winding of the first transformer 31.

The post-processing unit 40 is connected to secondary windings of the first through third transformers 31-33.

The post-processing unit 40 rectifies and filters the voltage provided by the secondary windings to output an output voltage. The post-processing unit 40 is formed of a three-phase circuit and includes a first output inductor 41, a first rectifier diode 42, a second output inductor 43, a second rectifier diode 44, a third output inductor 45 and a third rectifier diode 46. In the post-processing unit 40, one of the first through third output inductors 41, 43, and 45 and one of the first through third rectifier diodes 42, 44, and 46 form a pair. That is, the first output inductor 41 and the first rectifier diode 42 form a pair, the second output inductor 43 and the second rectifier diode 44 form another pair, and the third output inductor 45 and the third rectifier diode 46 form the other pair.

In detail, the first output inductor 41 has a first terminal connected to a first terminal of the load 50. The first rectifier diode 42 has a cathode connected to a second terminal of the first output inductor 41, and an anode connected to a second terminal of the load 50.

The second output inductor 43 has a first terminal connected the first terminal of the first output inductor 41. The first terminal of the second output inductor 43 is connected also to the first terminal of the load 50. The second rectifier diode 44 has a cathode connected to a second terminal of the second output inductor 44, and an anode connected to the anode of the first rectifier diode 42. The anode of the second rectifier diode 44 is connected also to the second terminal of the load 50.

The third output inductor 45 has a first terminal connected the first terminal of the second output inductor 43. The first terminal of the third output inductor 45 is connected also to the first terminal of the first output inductor 41 and the first terminal of the load 50. The third rectifier diode 46 has a cathode connected to a second terminal of the third output inductor 44, and an anode connected to the anode of the second rectifier diode 44. The anode of the third rectifier diode 46 is connected also to the anode of the first rectifier diode 42 and the second terminal of the load 50.

Meanwhile, a midpoint node between the first output inductor 41 and the first rectifier diode 42 is connected to the a first terminal of the secondary winding of the first transformer 31 and a second terminal of the secondary winding of the second transformer 32. A midpoint node between the second output inductor 43 and the second rectifier diode 44 is connected to the a first terminal of the secondary winding of the second transformer 32 and a second terminal of the secondary winding of the third transformer 33. A midpoint node between the third output inductor 45 and the third rectifier diode 46 is connected to the a first terminal of the secondary winding of the third transformer 33 and a second terminal of the secondary winding of the first transformer 31.

The control unit 60 is connected to the switching unit 20 and provides the switching unit 20 with carrier signals and reference voltages to control switching operation of the switching unit 20. Here, the control unit 60 performs the switching control through a three-phase duty control, which is described below with reference to FIGS. 2-8.

Thus, the isolated DC-DC converter 100 allows a designer or manufacturer of the converter to employ three transformers and output inductors which are smaller than those in a conventional converter and acquire an enhanced volumetric property that the volume of the converter may not increase even when the output current is large. Also, the isolated DC-DC converter 100 performs the switching operation by use of the three-phase duty control, which simplifies and facilitates the PWM control of the switching operation. Therefore, the isolated DC-DC converter 100 can enhance the output efficiency and lower the manufacturing cost of the converter.

Figure 2:
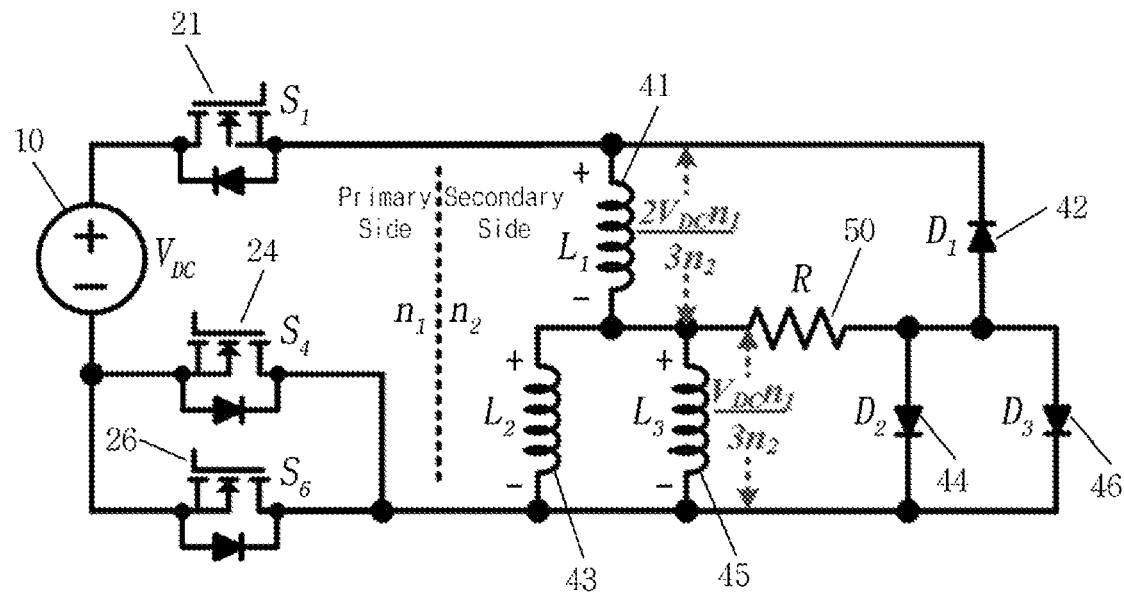
FIG. 2 illustrates an equivalent circuit of the isolated DC-DC converter of FIG. 1 in a first operation status.
Figure 3:
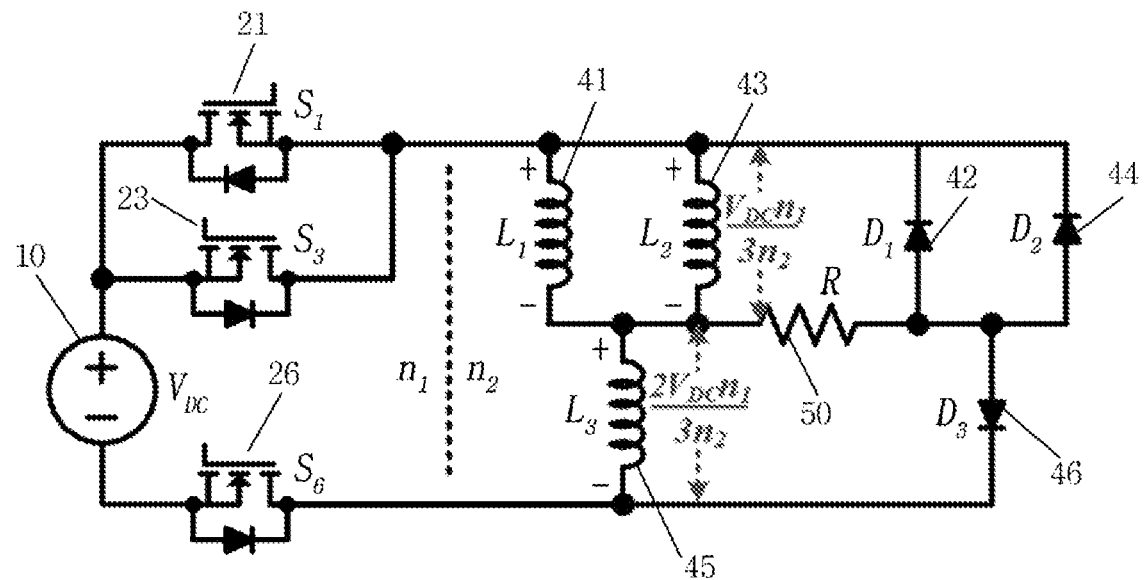
FIG. 3 illustrates an equivalent circuit of the isolated DC-DC converter of FIG. 1 in a second operation status.
Figure 4:
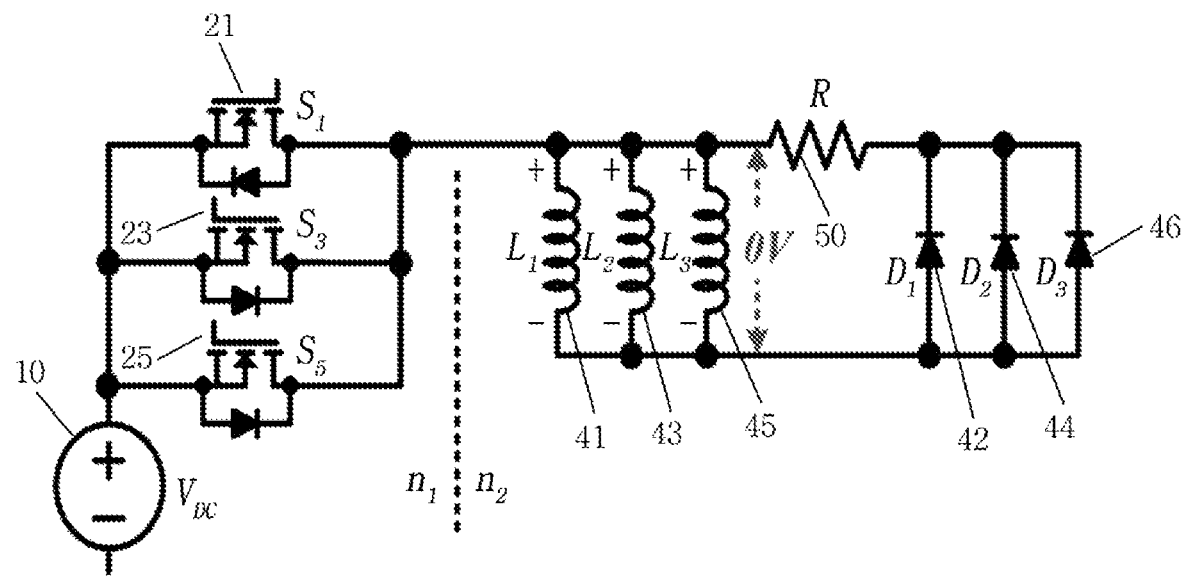
FIG. 4 illustrates an equivalent circuit of the isolated DC-DC converter of FIG. 1 in a third operation status.
Figure 5:
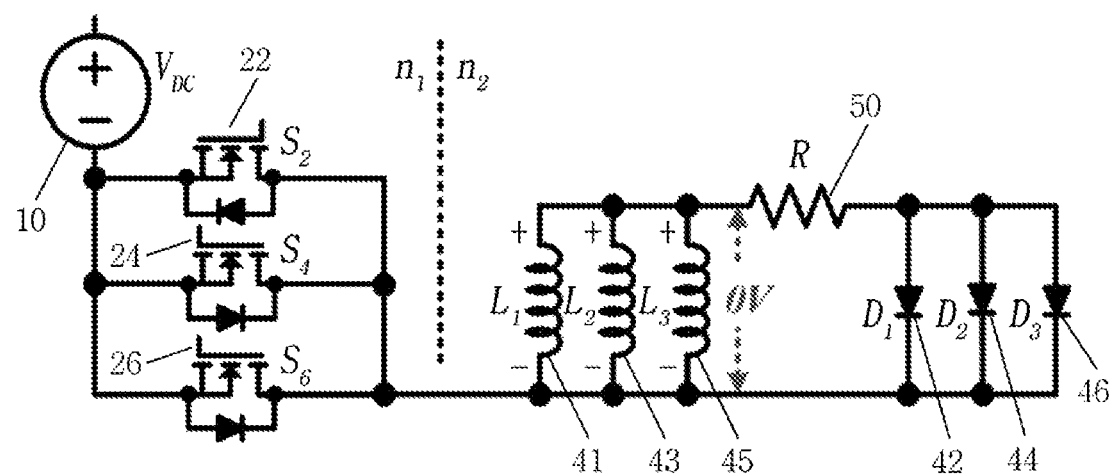
FIG. 5 illustrates an equivalent circuit of the isolated DC-DC converter of FIG. 1 in a fourth operation status.

FIG. 2 illustrates an equivalent circuit of the isolated DC-DC converter of FIG. 1 in a first operation status, FIG. 3 illustrates an equivalent circuit of the isolated DC-DC converter of FIG. 1 in a second operation status, FIG. 4 illustrates an equivalent circuit of the isolated DC-DC converter of FIG. 1 in a third operation status, and FIG. 5 illustrates an equivalent circuit of the isolated DC-DC converter of FIG. 1 in a fourth operation status.

In the switching unit 20, each switching leg has at least two switching states: "P" and "N". The switching state "P" denotes that a upper switch is turned on and a lower switch is turned off. The switching state "N" denotes that the upper switch is turned off and the lower switch is turned on.

In the description below, the overall switching state of the switching unit 20 is represented by a combination of three capital letters. For example, in case that the switching state of the first switching leg is "P" and the switching states of the second and third switching legs are "N", the overall switching state of the switching unit 20 is represented by [PNN]. Also, in case that the switching states of the first and third switching legs are "P" and the switching state of the second switching leg are "N", the overall switching state of the switching unit 20 is represented by [PNP].

Referring to FIGS. 1-5, the operation of the isolated DC-DC converter 100 changes according to the switching states of the switches in the switching unit 20.

In the first operation status, the switching unit 20 is in a switching state that only a single switching leg is in the "P" state. That is, the switching state of the switching unit 20 may be in a [PNN] state where the first switch 21, the fourth switch 24, and the sixth switch 26 are turned on while the other switches 22, 23 and 25 are turned off, or a [NPN] state where the second switch 22, the third switch 23, and the sixth switch 26 are turned on while the other switches 21, 24 and 25 are turned off, or a [NNP] state where the second switch 22, the fourth switch 24, and the fifth switch 25 are turned on while the other switches 21, 23 and 26 are turned off. In such a case, the secondary side circuit has a configuration that the load 50 is connected between a common node of the three output inductors 41, 43 and 45, i.e. the first terminals of the output inductors 41, 43 and 45, and a common node of the three rectifier diodes 42, 44 and 46, i.e. the second terminals of the rectifier diodes 42, 44 and 46, as shown in the equivalent circuit of FIG. 2.

In case that the switching unit 20 is in the [PNN] state, due to a voltage division according to impedances, a voltage of $⅔V_{DC}$ is applied across the first output inductor 41 after being stepped up or down according to the turns ratio, and a voltage of $⅓V_{DC}$ is applied across the second and third output inductors 43 and 45 after being stepped up or down according to the turns ratio. Here, "$V_{DC}$" denotes an output voltage of the power supply. At this time, the first output inductor 41 does not affect the output voltage across the load 50 because of the first rectifier diode 42 reverse-biased, but the second and third output inductors 43 and 45 affect the output voltage across the load 50 since the second and third rectifier diodes 44 and 46 are forward-biased. Therefore, a voltage of $⅓V_{DC}$ is applied across the load 50 after being stepped up or down according to the turns ratio.

In the cases of [NPN] and [NNP], the equivalent circuit of the isolated DC-DC converter 100 is similar to that in the case of [PNN], and the isolated DC-DC converter 100 is driven in the same way as in the case of [PNN]. Thus the operation of the isolated DC-DC converter 100 in the cases of [NPN] and [NNP] is omitted for simplicity.

In the second operation status, two switching legs among the three switching legs in the switching unit 20 are in the "P" state. That is, the switching state of the switching unit 20 may be in a [PPN] state where the first switch 21, the third switch 23, and the sixth switch 26 are turned on while the other switches 22, 24 and 25 are turned off, or a [PNP] state where the first switch 21, the fourth switch 24, and the fifth switch 25 are turned on while the other switches 22, 23 and 26 are turned off, or a [NPP] state where the second switch 22, the third switch 23, and the fifth switch 25 are turned on while the other switches 21, 24 and 26 are turned off. Similarly to the first operation status, the secondary side circuit has a configuration that the load 50 is connected between the common node of the three output inductors 41, 43 and 45 and the common node of the three rectifier diodes 42, 44 and 46 as shown in the equivalent circuit of FIG. 3.

In case that the switching unit 20 is in the [PPN] state, due to a voltage division according to impedances, a voltage of $⅓V_{DC}$ is applied across the first and second output inductors 41 and 43 after being stepped up or down according to the turns ratio, and a voltage of $⅔V_{DC}$ is applied across the third output inductor 45 after being stepped up or down according to the turns ratio. At this time, the first and second inductors 41 and 43 do not affect the output voltage across the load 50 because of the first and second rectifier diodes 42 and 44 are reverse-biased, but the third output inductor 45 affects the output voltage across the load 50 since the third rectifier diodes 46 is forward-biased. Therefore, a voltage of $⅔V_{DC}$ is applied across the load 50 after being stepped up or down according to the turns ratio.

In the cases of [PNP] and [NPP], the equivalent circuit of the isolated DC-DC converter 100 is similar to that in the case of [PPN], and the isolated DC-DC converter 100 is driven in the same way as in the case of [PPN]. Thus the operation of the isolated DC-DC converter 100 in the cases of [PNP] and [NPP] is omitted for simplicity.

In the third operation status shown in FIG. 4, all the switching legs in the switching unit 20 are in the "P" state. That is, the switching state of the switching unit 20 is [PPP] where the first switch 21, the third switch 23, and the fifth switch 25 are turned on while the other switches 22, 24 and 26 are turned off. In the fourth operation status shown in FIG. 5, all the switching legs in the switching unit 20 are in the "N" state. That is, the switching state of the switching unit 20 is [NNN] where the second switch 22, the fourth switch 24, and the sixth switch 26 are turned on while the other switches 21, 23 and 25 are turned off. In the third and fourth embodiments, zero volt is applied across the load 50.

Figure 6:
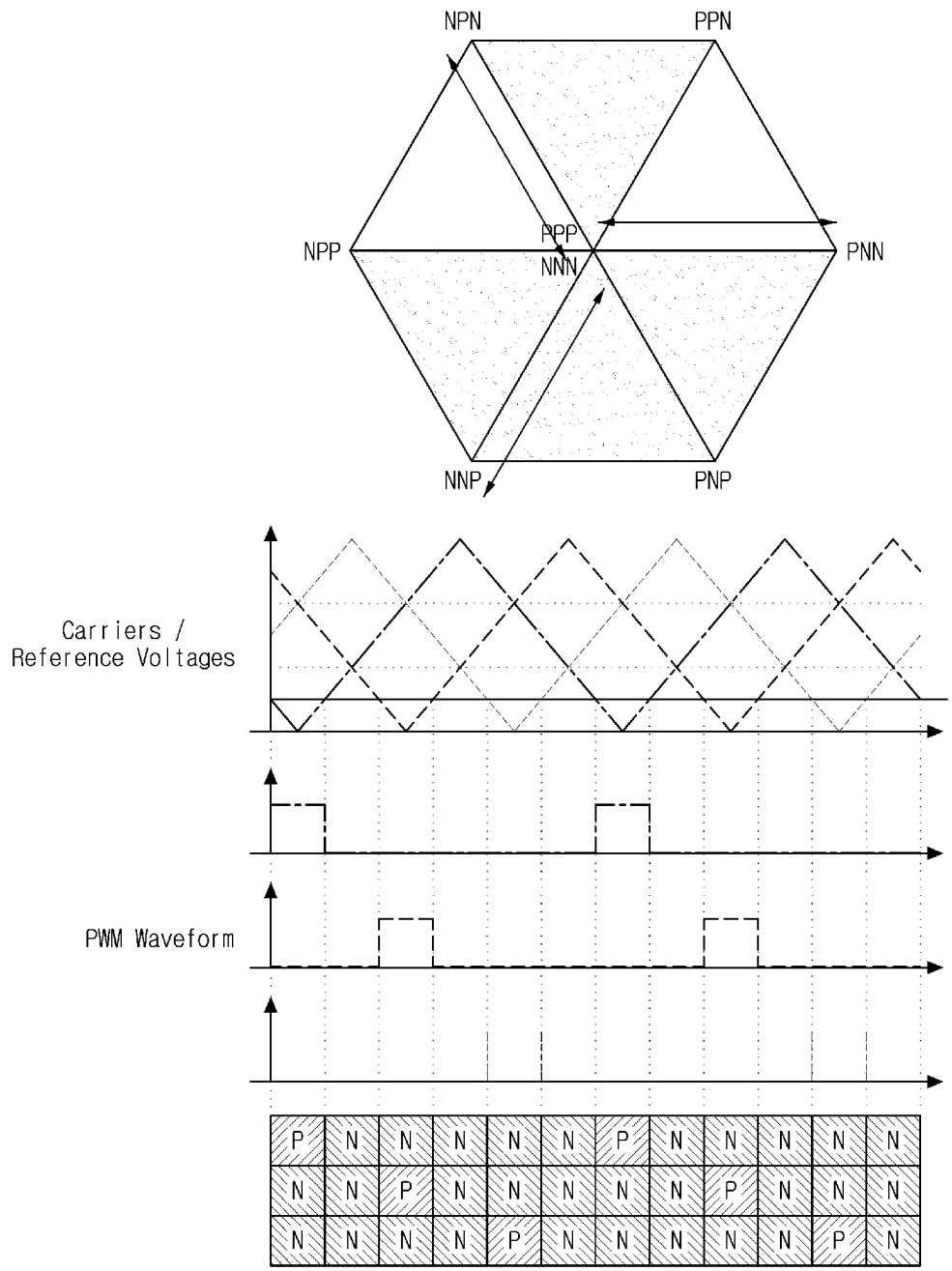
FIG. 6 illustrates state transitions and waveforms of carriers, reference voltages, and PWM signals according to a first embodiment of PWM control in the isolated DC-DC converter of FIG. 1.
Figure 7:
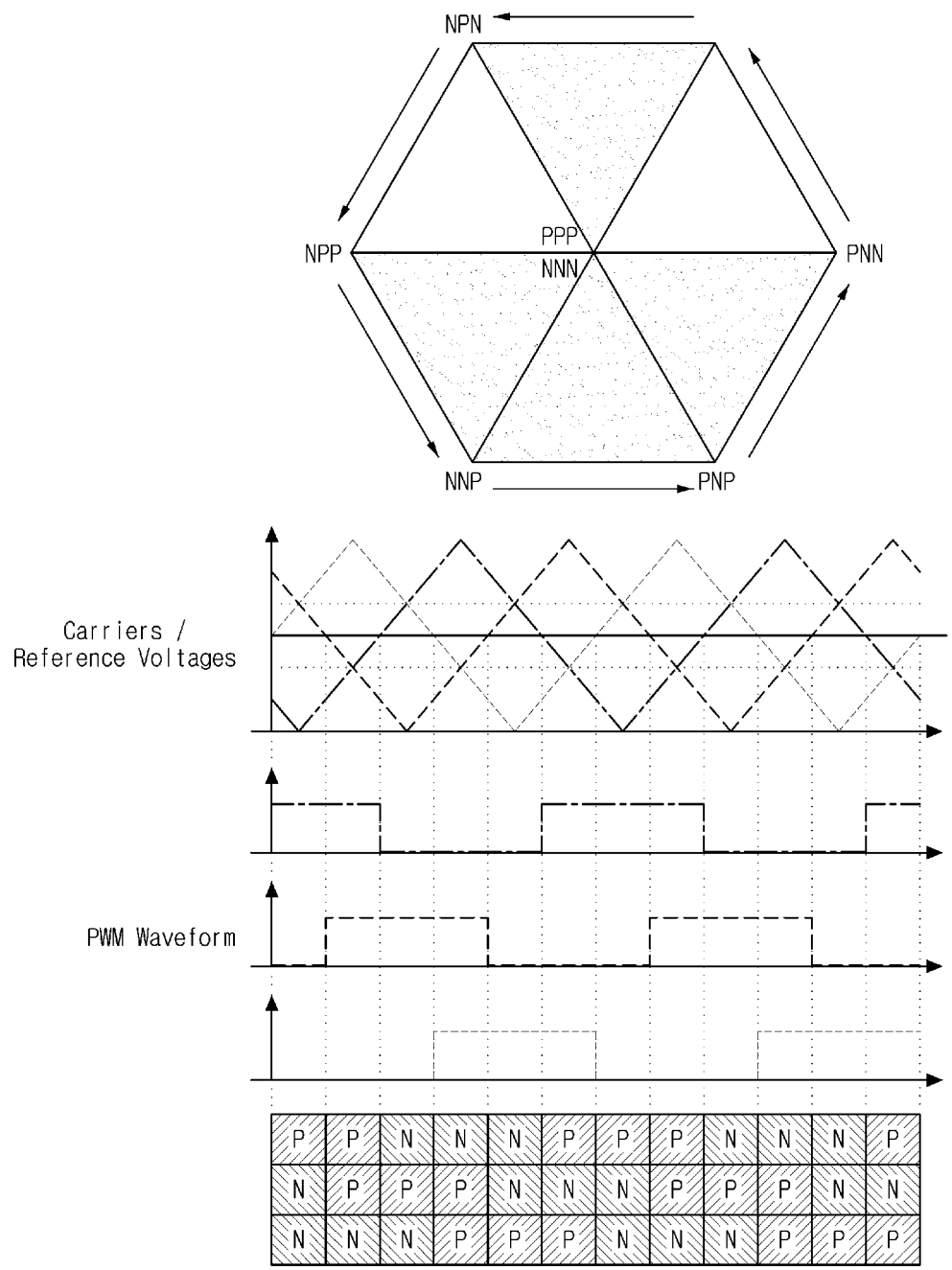
FIG. 7 illustrates state transitions and waveforms of carriers, reference voltages, and PWM signals according to a second embodiment of PWM control in the isolated DC-DC converter of FIG. 1.
Figure 8:
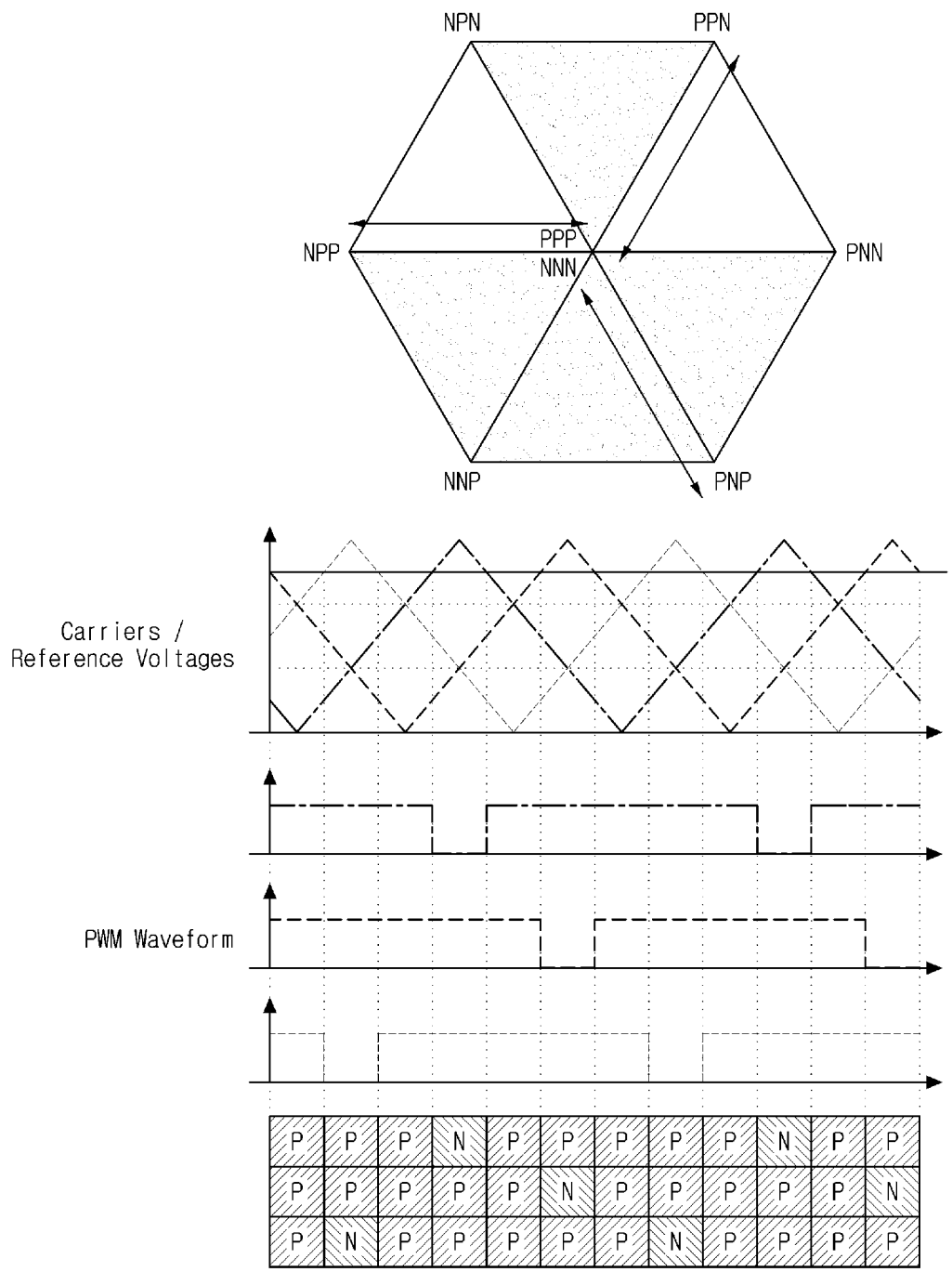
FIG. 8 illustrates state transitions and waveforms of carriers, reference voltages, and PWM signals according to a third embodiment of PWM control in the isolated DC-DC converter of FIG. 1.

FIG. 6 illustrates state transitions and waveforms of carriers, reference voltages, and PWM signals according to a first embodiment of PWM control in the isolated DC-DC converter of FIG. 1. FIG. 7 illustrates state transitions and waveforms of carriers, reference voltages, and PWM signals according to a second embodiment of PWM control in the isolated DC-DC converter of FIG. 1. FIG. 8 illustrates state transitions and waveforms of carriers, reference voltages, and PWM signals according to a third embodiment of PWM control in the isolated DC-DC converter of FIG. 1.

Referring to FIGS. 1-8, the isolated DC-DC converter 100 can perform the PWM control using three carriers phase-shifted by 120 degrees from each other and DC reference voltages.

In the first embodiment shown in FIG. 6, the PWM control is performed using the reference voltages ranging from 0 to ⅓ volt (V). In other words, two reference voltages indicated by dotted lines have constant levels in a range from zero to ⅓V, and the three carriers are phase-shifted by 120 degrees from each other. In the first embodiment, a switching state such as [PNN], [NPN], or [NNP] where a voltage of $⅓V_{DC}×n$ is applied to the secondary side and another switching state such as [NNN] where 0V is applied to the secondary side are alternating. Here, "n" signifies the turns ratio (n1/n2), that is, the ratio of the number of windings in the primary side to the number of windings in the secondary side. In the first embodiment, as the duty ratio is increased, the time period during which the voltage of $⅓V_{DC}×n$ is applied to the secondary side is increased, and the output voltage is increased. Thus, the control unit 50 can increase the output voltage by controlling the duty ratio to be increased while the reference voltages ranging from 0V to ⅓ V is applied so that the time for which the voltage of $⅓V_{DC}×n$ is applied to the post-processing unit 40 is increased.

In the second embodiment shown in FIG. 7, the PWM control is performed using the reference voltages ranging from ⅓V to ⅔V. In other words, two reference voltages indicated by dotted lines have constant levels in a range from ⅓V to ⅔V, and the three carriers are phase-shifted by 120 degrees from each other. In the second embodiment, a switching state such as [PPN], [PNP], or [NPP] where a voltage of ⅔$V_{DC}$×n is applied to the secondary side and another switching state such as [PNN], [NPN], or [NNP] where the voltage of ⅓$V_{DC}$×n is applied to the secondary side are alternating. In the second embodiment, as the duty ratio is increased, the time period during which the voltage of ⅔$V_{DC}$×n is applied to the secondary side is increased while the time period during which the voltage of ⅓$V_{DC}$×n is applied to the secondary side is decreased, and the overall output voltage is increased. Thus, the control unit 50 can increase the output voltage by controlling the duty ratio to be increased while the reference voltages ranging from ⅓V to ⅔V is applied, so that the time for which the voltage of ⅓$V_{DC}$×n is applied to the post-processing unit 40 is decreased but the time for which the voltage of ⅔$V_{DC}$×n is applied is increased.

In the third embodiment shown in FIG. 8, the PWM control is performed using the reference voltages ranging from ⅔V to 1V. In other words, two reference voltages indicated by dotted lines have constant levels in a range from ⅔V to 1V, and the three carriers are phase-shifted by 120 degrees from each other. In the second embodiment, a switching state such as [PPN], [PNP], or [NPP] where a voltage of ⅔$V_{DC}$×n is applied to the secondary side and another switching state such as [PPP] where 0V is applied to the secondary side are alternating. Meanwhile, in the third embodiment, the voltage applied to the output inductors 41, 43, and 45 fluctuates to a great extent, and thus the current ripples increase in the output inductors 41, 43, and 45.

Therefore, the controller 50 may perform the PWM control such that the operation status remains only in the first embodiment and the second embodiment where the output voltage can be increased while reducing the ripples in the output current.

Figure 9:
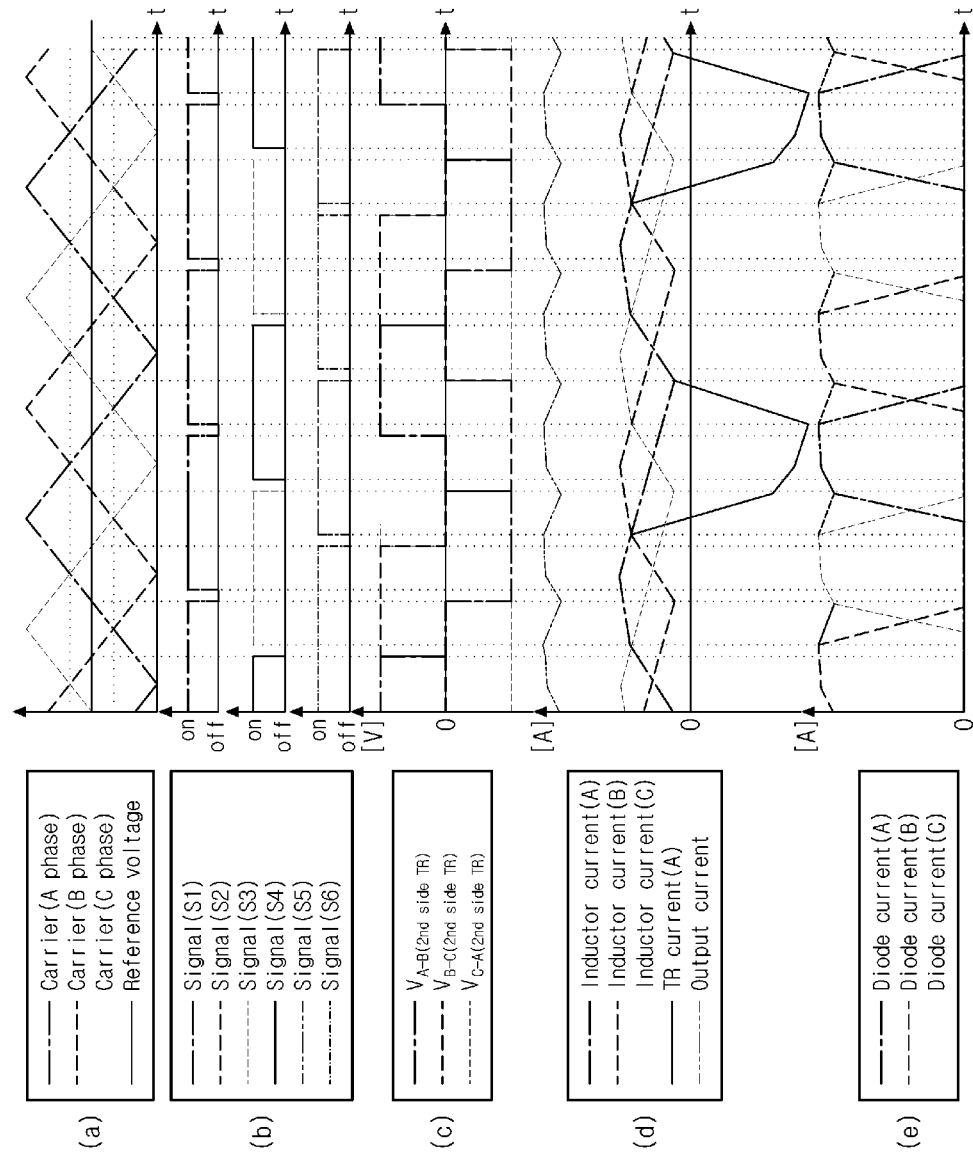
FIG. 9 illustrates signal waveforms during the PWM control shown in FIG. 6.
Figure 10:
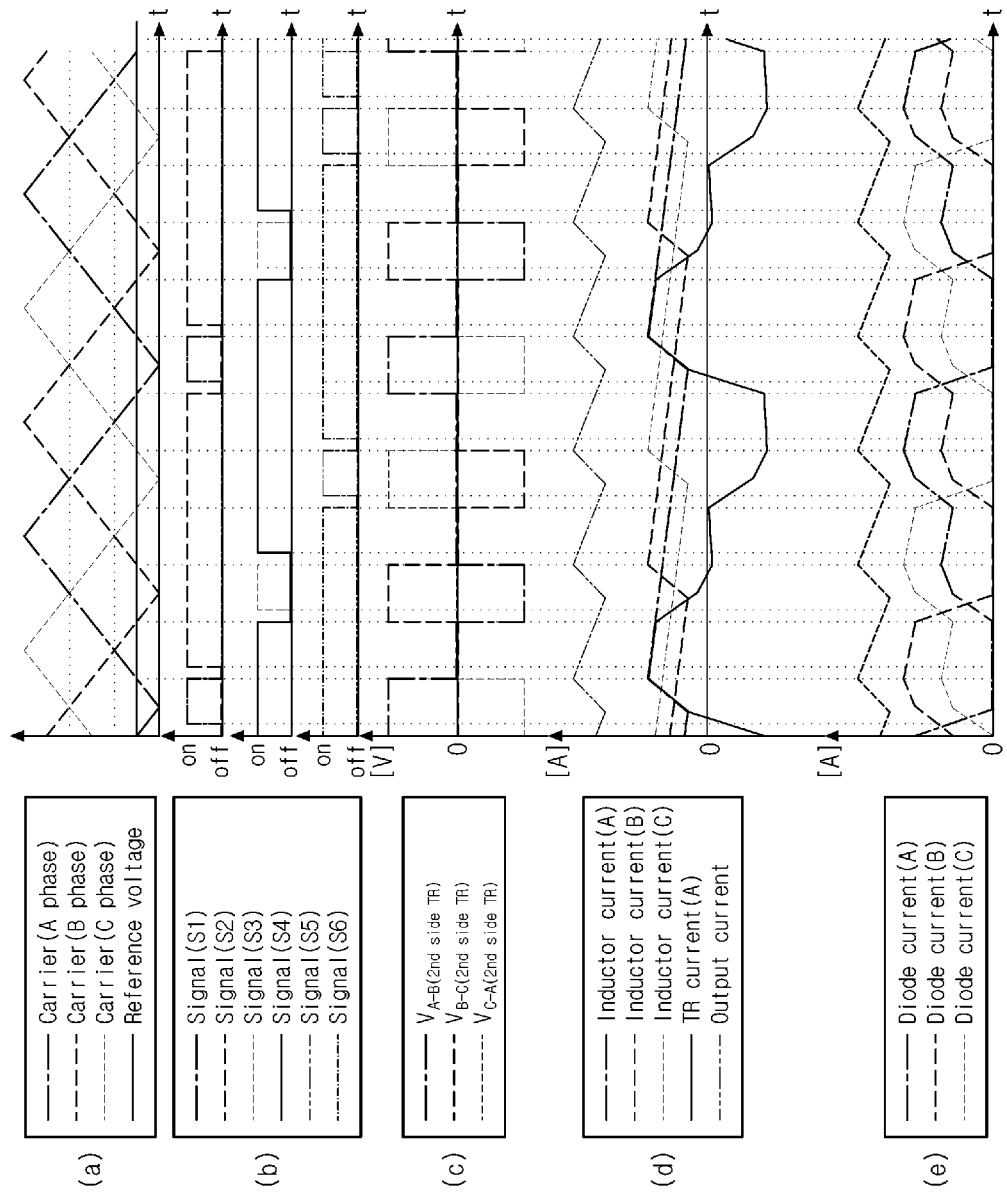
FIG. 10 illustrates simulation waveforms for the signals shown in FIG. 9 assuming a certain duty ratio.

FIG. 9 illustrates signal waveforms during the PWM control shown in FIG. 6, and FIG. 10 illustrates simulation waveforms for the signals shown in FIG. 9 assuming a certain duty ratio.

Now, the waveforms of the signals in components of the isolated DC-DC converter 100 driven according to the first embodiment are described with reference to FIG. 9 along with FIGS. 1 and 6.

According to the first embodiment, the components in the isolated DC-DC converter 100 operates as shown in the waveform diagrams of FIG. 9. Here, FIG. 9(a) shows waveforms of the carriers and the reference voltages, FIG. 9(b) shows waveforms representing the switching states of the switching unit 20, FIG. 9(c) shows waveforms of the voltages in the secondary side of the transformer unit 30, FIG. 9(d) shows waveforms of the currents in the three-phase output inductors 41, 43 and 45, the current in the first transformer 31, and the output current, and FIG. 9(e) shows waveforms of the currents of the rectifier diodes 42, 44, and 46.

The voltages in the secondary side of the transformer unit 30 are phase-to-phase voltages, and the waveforms of the voltages are square waves. The waveforms of the currents in the three-phase output inductors 41, 43 and 45 exhibit phase differences of 120 degrees due to their interleaved operations. Also, the output current is a sum of the currents in the three-phase output inductors 41, 43 and 45, and thus contains current ripples of which frequency corresponds to three times the switching frequency.

Here, the output inductors of two phases operate through two forward-biased rectifier diodes in the isolated DC-DC converter 100 according to the first embodiment. Thus, it can be found that current flows through the two rectifier diodes in each of the active periods.

FIG. 10 illustrates simulation waveforms for the signals shown in FIG. 9 assuming a duty ratio of 1/6. Here, FIG. 10(a) shows waveforms of the carriers and the reference voltages, FIG. 10(b) shows waveforms of the voltages in the secondary side of the transformer unit 30, FIG. 10(c) shows waveforms of the currents in the three-phase output inductors 41, 43 and 45, the current in the first transformer 31, and the output current, and FIG. 10(d) shows waveforms of the currents of the rectifier diodes 42, 44, and 46. Thus, in the simulation of the first embodiment, it can be seen that the isolated DC-DC converter 100 can actually perform the switching operation using the three-phase duty control.

Figure 11:
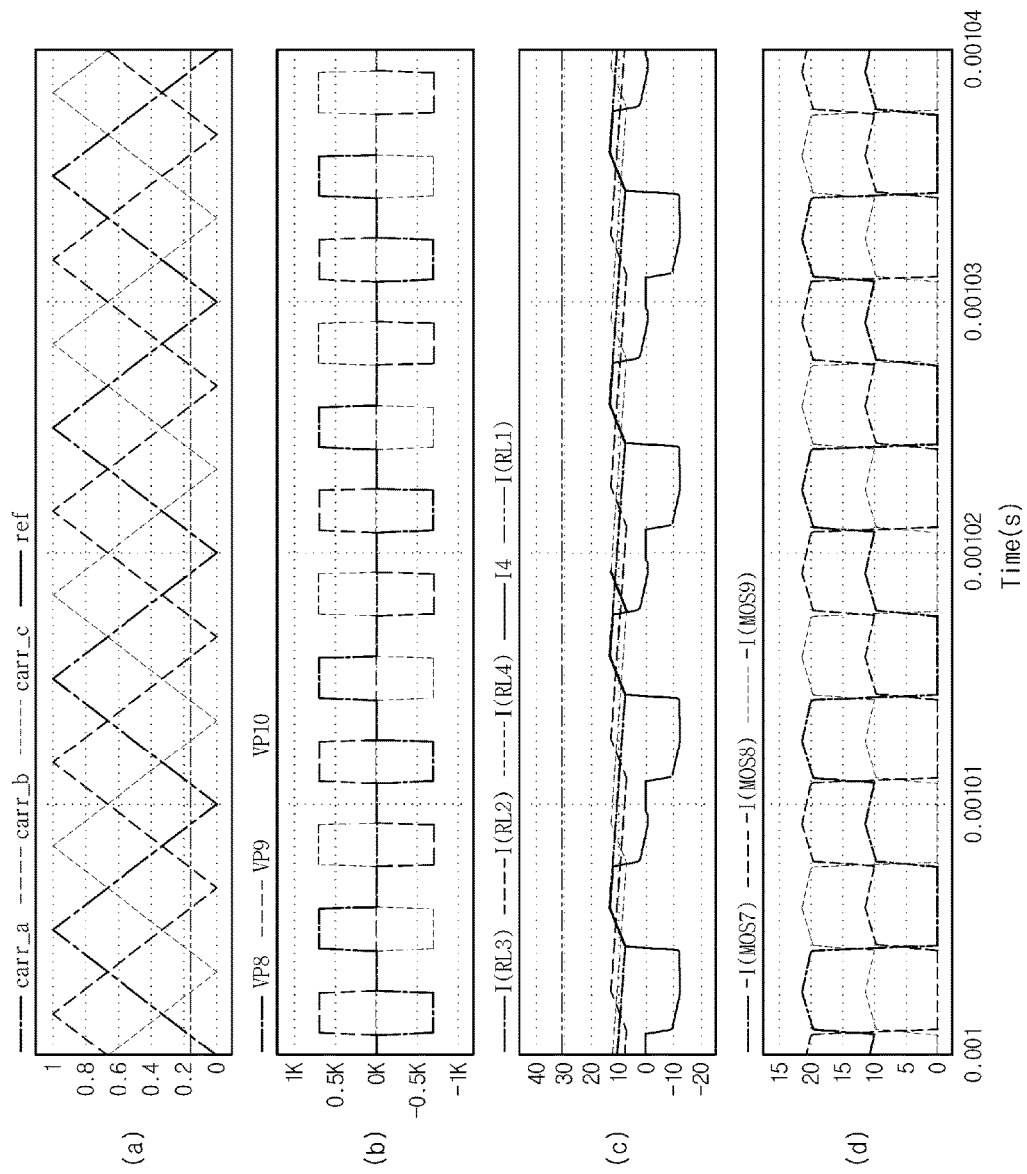
FIG. 11 illustrates signal waveforms during the PWM control shown in FIG. 7.
Figure 12:
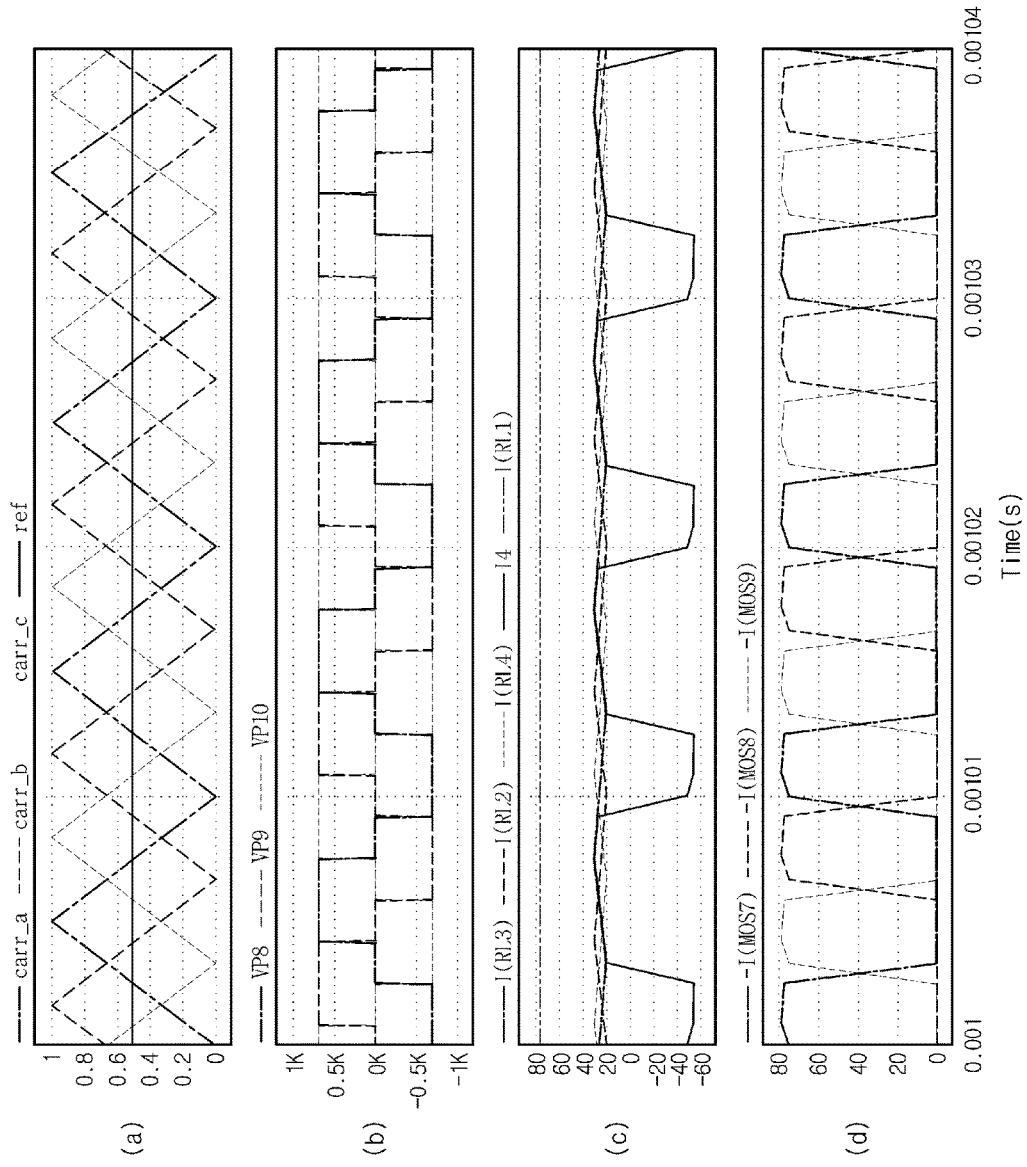
FIG. 12 illustrates simulation waveforms for the signals shown in FIG. 11 assuming a certain duty ratio.

FIG. 11 illustrates signal waveforms during the PWM control shown in FIG. 7, and FIG. 12 illustrates simulation waveforms for the signals shown in FIG. 11 assuming a certain duty ratio.

Now, the waveforms of the signals in the components of the isolated DC-DC converter 100 driven according to the second embodiment are described with reference to FIG. 11 along with FIGS. 1 and 7.

According to the second embodiment, the components in the isolated DC-DC converter 100 operates as shown in the waveform diagrams of FIG. 11. Here, FIG. 9(a) shows waveforms of the carriers and the reference voltages, FIG. 11(b) shows waveforms representing the switching states of the switching unit 20, FIG. 11(c) shows waveforms of the voltages in the secondary side of the transformer unit 30, FIG. 11(d) shows waveforms of the currents in the three-phase output inductors 41, 43 and 45, the current in the first transformer 31, and the output current, and FIG. 11(e) shows waveforms of the currents of the rectifier diodes 42, 44, and 46.

The voltages in the secondary side of the transformer unit 30 are phase-to-phase voltages, and the waveforms of the voltages are square waves. The waveforms of the currents in the three-phase output inductors 41, 43 and 45 exhibit phase differences of 120 degrees due to their interleaved operations. At this time, since there is an interval in which the output voltage changes drastically, an inflection point appears in the currents of the three-phase output inductors 41, 43, and 45. Also, the output current is a sum of the currents in the three-phase output inductors 41, 43 and 45.

Here, the isolated DC-DC converter 100 according to the second embodiment includes an operation mode that the output inductor of a single phase operates through one forward-biased rectifier diode. Thus, it can be seen that a period in which the current flows through a single rectifier diode and another period in which the current flows through two rectifier diodes appear in the waveform.

FIG. 12 illustrates simulation waveforms for the signals shown in FIG. 10 assuming a duty ratio of 1/2. Here, FIG. 12(a) shows waveforms of the carriers and the reference voltages, FIG. 12(b) shows waveforms of the voltages in the secondary side of the transformer unit 30, FIG. 12(c) shows waveforms of the currents in the three-phase output inductors 41, 43 and 45, the current in the first transformer 31, and the output current, and FIG. 12(d) shows waveforms of the currents of the rectifier diodes 42, 44, and 46. 46. Thus, it can be seen that the isolated DC-DC converter 100 can actually perform the switching operation using the three-phase duty control in the simulation of the second embodiment also.

Figure 13:
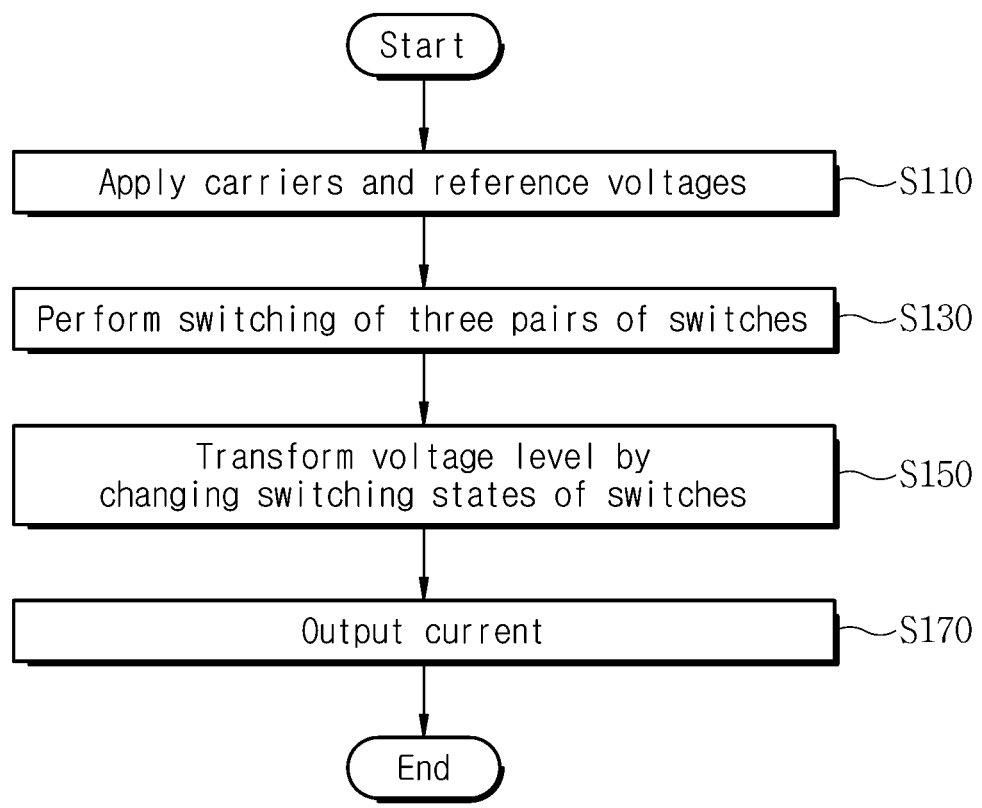
FIG. 13 is a flowchart showing a method of driving an isolated DC-DC converter according to an embodiment of the present disclosure.

FIG. 13 is a flowchart showing a method of driving the isolated DC-DC converter according to an embodiment of the present disclosure.

Referring to FIGS. 1 and 13, according to the driving method according to an embodiment of the present disclosure, the isolated DC-DC converter can be PWM-controlled simply by switching the converter using the three-phase duty control. Thus, the isolated DC-DC converter 100 can achieve high output efficiency and low manufacturing cost.

In operation S110, the control unit 60 applies the carriers and the reference voltages to the switching unit 20. Here, the control unit 60 applies the three carriers phase-shifted by 120 degrees and the DC reference voltages to the switching unit 20. The reference voltages may be in a range from 0V to $\frac{2}{3}$V. The switching unit 20 includes three switching legs connected in parallel each of which includes a pair of switches.

In operation S130, the switching unit 20 performs switching of the three switching legs, i.e. three pairs of switches, according to the carriers and the reference voltages. In case that the reference voltages ranges from 0V to $\frac{1}{3}$V, the switching unit 20 switches on the first switch 21, the fourth switch 24, and the sixth switch 26 while switching off the other switches 22, 23 and 25 (i.e. the switching state [PNN]), switches on the second switch 22, the third switch 23, and the sixth switch 26 while switching off the other switches 21, 24 and 25 (i.e. the switching state [NPN]), or switches on the second switch 22, the fourth switch 24, and the fifth switch 25 while switching off the other switches 21, 23 and 26 (i.e. the switching state [NNP]). In case that the reference voltages ranges from $\frac{1}{3}$V to $\frac{2}{3}$V, the switching unit 20 switches on the first switch 21, the third switch 23, and the sixth switch 26 while switching off the other switches 22, 24, and 25 (i.e. the switching state [PPN]), switches on the first switch 21, the fourth switch 24, and the fifth switch 25 while switching off the other switches 21, 23, and 26 (i.e. the switching state [PNP]), or switches on the second switch 22, the third switch 23, and the fifth switch 25 while switching off the other switches 21, 24, 26 are opened (i.e. the switching state [NPP]).

In operation S150, the transformer unit 30 steps up or down the output voltage by changing the switching states of the switches. Here, the transformer unit 30 includes the first through third transformer 31-33. The first through third transformers 31-33 have the same specifications as each other. Also, in each of the first through third transformers 31-33, it may be preferable that the turns ratio is set such that the number of turns of the primary winding is larger than the number of turns of the secondary winding. The transformer unit 30 transforms the voltage output by the switching unit 20 according to the turns ratio.

In operation S170, the post-processing unit 40 generates and outputs the output current for the voltage transformed by the transformer unit 30 according to the load 50. Here, the post-processing unit 40 may rectify and filter the voltage provided by the secondary windings of the transformer unit 30 before outputting the output current.

The description of the disclosure is merely exemplary in nature and, thus, variations that do not depart from the substance of the disclosure are intended to be within the scope of the disclosure. Such variations are not to be regarded as a departure from the spirit and scope of the disclosure.

The invention claimed is:

1. An isolated DC-DC converter, comprising:
a switching unit connected to terminals of a power supply, comprising three pairs of switches connected in parallel, and configured to switch on and off the three pairs of switches;
a transformer unit comprising a first through third transformers, each having a primary winding connected to the switching unit and a secondary winding that are wound in a predetermined turns ratio and transforming a voltage applied to the primary winding according to the turns ratio;
a post-processing unit connected to the secondary winding of each of the first through third transformers and comprising plural inductors, the post-processing unit being configured to rectify and filter a voltage induced in the secondary winding to generate and output an output voltage; and
a control unit connected to the switching unit and configured to control switching operation of the switching unit by providing the switching unit with carriers and reference voltages,
wherein the post-processing unit comprises:
a first output inductor, of the plural inductors, having a terminal connected to a first terminal of a load;
a first rectifier diode having a cathode connected to a second terminal of the first output inductor and an anode connected to a second terminal of the load;
a second output inductor, of the plural inductors, having a first terminal connected the first terminal of the first output inductor;
a second rectifier diode having a cathode connected to a second terminal of the second output inductor and an anode connected to the anode of the first rectifier diode;
a third output inductor, of the plural inductors, having a first terminal connected the first terminal of the second output inductor; and
a second rectifier diode having a cathode connected to a second terminal of the third output inductor and an anode connected to the anode of the second rectifier diode.

2. The isolated DC-DC converter of claim 1, wherein the switching unit comprises:
a first switch having a first terminal connected to a first terminal of the power supply;
a second switch having a first terminal connected to a second terminal of the first switch, and a second terminal connected to a second terminal of the power supply;
a third switch having a first terminal connected to the first terminal of the first switch;
a fourth switch having a first terminal connected to a second terminal of the third switch, and a second terminal connected to the second terminal of the second switch;
a fifth switch having a first terminal connected to the first terminal of the third switch; and
a sixth switch having a first terminal connected to a second terminal of the fifth switch, and a second terminal connected to the second terminal of the fourth switch.

3. The isolated DC-DC converter of claim 2,
wherein a midpoint node between the first switch and the second switch is connected to a first terminal of the primary winding of the first transformer and a second terminal of the primary winding of the second transformer,
wherein a midpoint node between the third switch and the fourth switch is connected to a first terminal of the primary winding of the second transformer and a second terminal of the primary winding of the third transformer, wherein a midpoint node between the fifth switch and the sixth switch is connected to a first terminal of the primary winding of the third transformer and a second terminal of the primary winding of the first transformer.

4. The isolated DC-DC converter of claim 1,
wherein the first through the third transformers have same configuration and/or structure as each other,
wherein, in each of the first through third transformers, the turns ratio is set such that the number of turns of the primary winding is larger than the number of turns of the secondary winding.

5. The isolated DC-DC converter of claim 1,
wherein a midpoint node between the first output inductor and the first rectifier diode is connected to a first terminal of the secondary winding of the first transformer and a second terminal of the secondary winding of the second transformer;
wherein a midpoint node between the second output inductor and the second rectifier diode is connected to the a first terminal of the secondary winding of the second transformer and a second terminal of the secondary winding of the third transformer;
wherein a midpoint node between the third output inductor and the third rectifier diode is connected to the a first terminal of the secondary winding of the third transformer and a second terminal of the secondary winding of the first transformer.

6. The isolated DC-DC converter of claim 1, wherein the control unit provides the switching unit with three carries phase-shifted by 120 degrees from each other and the reference voltages in a direct current voltage range from 0 volt to $2/3$ volt to control the switching unit.

7. The isolated DC-DC converter of claim 6, wherein the control unit increases the output voltage by controlling the duty ratio to be increased while the reference voltages ranging from 0V to $1/3$ V is applied, so that a time period for which the reference voltage of $1/3V_{DC} \times n$ is applied to the post-processing unit is increased, where $V_{DC}$ denotes a voltage supplied from the power supply, and "n" denotes a turns ratio that is a ratio of a number of windings in a primary side to a number of windings in a secondary side in the transformer unit.

8. The isolated DC-DC converter of claim 6, wherein the control unit increases the output voltage by controlling the duty ratio to be increased while the reference voltages ranging from $1/3$V to $2/3$V is applied, so that a time period for which the voltage of $1/3V_{DC} \times n$ is applied to the post-processing unit is decreased but a time period for which the voltage of $2/3 V_{DC} \times n$ is applied to the post-processing unit is increased, wherein $V_{DC}$ denotes a voltage supplied from the power supply.

9. A method of driving an isolated dc-dc converter, comprising:

applying carriers and reference voltages to a control unit of the isolated dc-dc converter, the isolated dc-dc converter comprising a switching unit comprising three pairs of switches connected in parallel;

changing a switching state of the switching unit to one of plural switching states, using the carriers and the reference voltages;

transforming a level of a voltage output by the switching unit in a transformer unit comprising a first through third transformer, each transformer comprising a primary winding connected to the switching unit and a secondary winding connected to a post-processing unit; and rectifying and filtering, by the post-processing unit, a transformed voltage to generate an output voltage, the post-processing unit comprising plural inductors, wherein the post-processing unit comprises:

a first output inductor, of the plural inductors, having a terminal connected to a first terminal of a load;

a first rectifier diode having a cathode connected to a second terminal of the first output inductor and an anode connected to a second terminal of the load;

a second output inductor, of the plural inductors, having a first terminal connected the first terminal of the first output inductor;

a second rectifier diode having a cathode connected to a second terminal of the second output inductor and an anode connected to the anode of the first rectifier diode;

a third output inductor, of the plural inductors, having a first terminal connected the first terminal of the second output inductor; and a second rectifier diode having a cathode connected to a second terminal of the third output inductor and an anode connected to the anode of the second rectifier diode.

* * * * *